United States Patent
Booth et al.

(10) Patent No.: US 9,087,928 B2
(45) Date of Patent: Jul. 21, 2015

(54) HIGH DENSITY MEMORY CELLS USING LATERAL EPITAXY

(71) Applicant: International Business Machines Corporation, Armonk, NY (US)

(72) Inventors: Roger A. Booth, Irvine, CA (US); Kangguo Cheng, Albany, NY (US); Joseph Ervin, Hopewell Junction, NY (US); David M. Fried, Brewster, NY (US); Byeong Y. Kim, Lagrangeville, NY (US); Chengwen Pei, Danbury, CT (US); Ravi M. Todi, San Diego, CA (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 13/788,406

(22) Filed: Mar. 7, 2013

(65) Prior Publication Data
US 2013/0183806 A1    Jul. 18, 2013

Related U.S. Application Data

(62) Division of application No. 13/118,881, filed on May 31, 2011, now Pat. No. 8,829,585.

(51) Int. Cl.
*H01L 21/20* (2006.01)
*H01L 29/92* (2006.01)
(Continued)

(52) U.S. Cl.
CPC .......... *H01L 29/92* (2013.01); *H01L 27/10829* (2013.01); *H01L 27/10861* (2013.01); *H01L 27/1203* (2013.01)

(58) Field of Classification Search
CPC .............. H01L 29/945; H01L 29/7827; H01L 21/2022; H01L 21/92; H01L 27/1203; H01L 27/10861; H01L 27/10829
USPC ........... 257/88, 304, 532, 296, 301–302, 506, 257/510; 438/388, 243, 238, 151, 47, 382
See application file for complete search history.

(56) References Cited

U.S. PATENT DOCUMENTS

| 5,316,962 A | 5/1994 | Matsuo et al. |
| 5,466,625 A | 11/1995 | Hsieh et al. |

(Continued)

OTHER PUBLICATIONS

Kazuo Terada et al.; "A New DRAM Cell with a Transistor on a Lateral Epitaxial Silicon Layer (TOLE Cell)"; IEEE Transactions on Electron Devices; vol. 37, No. 9, Sep. 1990, pp. 2052-2057.

*Primary Examiner* — Mohammed Shamsuzzaman
(74) *Attorney, Agent, or Firm* — Whitham, Curtis & Christofferson & Cook, P.C; Joseph P. Abate

(57) ABSTRACT

In a vertical dynamic memory cell, monocrystalline semiconductor material of improved quality is provided for the channel of an access transistor by lateral epitaxial growth over an insulator material (which complements the capacitor dielectric in completely surrounding the storage node except at a contact connection structure, preferably of metal, from the access transistor to the storage node electrode) and etching away a region of the lateral epitaxial growth including a location where crystal lattice dislocations are most likely to occur; both of which features serve to reduce or avoid leakage of charge from the storage node. An isolation structure can be provided in the etched region such that space is provided for connections to various portions of a memory cell array.

5 Claims, 14 Drawing Sheets

(51) Int. Cl.
  *H01L 27/108* (2006.01)
  *H01L 27/12* (2006.01)

(56) References Cited

U.S. PATENT DOCUMENTS

| | | |
|---|---|---|
| 5,506,163 A | 4/1996 | Moriya |
| 5,744,386 A | 4/1998 | Kenney |
| 5,792,685 A | 8/1998 | Hammerl et al. |
| 5,843,820 A | 12/1998 | Lu |
| 5,893,735 A * | 4/1999 | Stengl et al. ............ 438/243 |
| 6,218,693 B1 | 4/2001 | Lu |
| 7,195,972 B2 * | 3/2007 | Chidambarrao et al. ..... 438/243 |
| 2005/0064710 A1 * | 3/2005 | Chidambarrao et al. ..... 438/689 |
| 2008/0230822 A1 * | 9/2008 | Cheng ............................ 257/302 |
| 2010/0144106 A1 * | 6/2010 | Cho et al. ...................... 438/243 |
| 2012/0171827 A1 * | 7/2012 | Pei et al. ....................... 438/243 |

\* cited by examiner (1) Bit line
(2) Word line
(3) Drain area
(4) Source area
(5) $SiO_2$ film
(6) Capacitor plate
(7) Capacitor insulator film
(8) Charge storage electrode
(9) Si substrate SiO₂ film    Poly-Si film Epliaxial Si

US 9,087,928 B2

HIGH DENSITY MEMORY CELLS USING LATERAL EPITAXY

FIELD OF THE INVENTION

The present invention generally relates to high density dynamic random access memory (DRAM) structures and, more particularly to DRAM structures having high integration density and reduced leakage of stored charge and capable of operating reliably at reduced voltages with reduced amounts of stored charge.

BACKGROUND OF THE INVENTION

Memory that can be rapidly accessed is essential to the operation of any digital data processing device and programmed digital logic circuits. The data storage requirements can often be quite large since separate storage is often required for input data, operands and/or results of logic operations in addition to the program which provides control of the logic circuits for operating on the digital data. Accordingly, many types of memory devices have been developed to answer many different requirements in regard to trade-offs between access time, cost and required storage capacity.

Dynamic random access memories (DRAMs) are often the memory device type of choice where access time is moderate but low cost and very large storage capacity are of paramount importance. Such devices usually use only a single transistor for access to any given memory cell and store data as charge in a capacitor which can be selectively accessed by control of that single transistor. Many different technologies have been developed to enhance the integration density of such memories until many megabytes of storage may be formed on a single semiconductor chip of modest area. Access time is generally quite rapid but can be slowed during a "worst-case" access time by the need to periodically refresh the charge stored in the memory cells because of necessarily finite levels of charge leakage through the access transistors and other potential leakage paths and, for any access, by the response time of sense amplifiers. Such sense amplifiers which must react to whatever charge may remain in a storage capacitor (often referred to, for generality, as a storage node) at the time the memory cell is accessed are initially brought to a balanced, metastable state and then imbalanced by the voltage due to the charge or lack thereof stored in the storage node when the storage node is connected to a sense amplifier input; causing the sense amplifier to assume one of two stable states in accordance with the charge (or lack thereof) representing the stored data. It should be appreciated that the time required for a sense amplifier to assume a stable state and the likelihood that the correct stable state will be assumed can both be compromised by reduction in remaining stored charge due to leakage for a given refresh cycle frequency while increased refresh frequency and duration reduces the periods during which the memory (or particular portion of the memory) can be accessed. Errors and increases in sense amplifier response time can also be caused by alteration of stored charge due to impingement on a memory cell transistor, capacitor and/or conductor by alpha particles that cause ionization and thus produce electrical charge.

Additionally, a limitation on potential integration density of DRAMs is limitation on the design and location of access transistors imposed by the technology used to form the storage capacitors. For example, integration density can be increased if the access transistor can be placed above the storage node. However, preferred so-called deep trench (DT) capacitors which require etching a trench, lining the trench with a capacitor dielectric (e.g. oxide) and then filling the trench with polysilicon or other semiconductor material has necessarily limited the designs of transistors and the quality of semiconductor that can be provided for their formation above a storage node formed in such a manner.

SUMMARY OF THE INVENTION

It is therefore an object of the present invention to provide a memory cell having good immunity to alpha-particle noise while having substantially reduced leakage and operable at reduced voltage and power without reduction of operating margins.

It is another object of the invention to provide a dynamic random access memory (DRAM) structure capable of significantly improved performance that can be manufactured at high integration density.

It is a further object of the invention to provide a method for manufacturing a high integration density DRAM structure having reduced charge leakage and good alpha particle noise immunity and providing defect-free monocrystalline semiconductor material above a deep trench storage node/capacitor.

In order to accomplish these and other objects of the invention, a memory cell and a semiconductor device including such a memory cell are provided wherein the memory cell includes a storage node surrounded by dielectric, and an access transistor formed of monocrystalline semiconductor material devoid of crystal lattice dislocations above a portion of the storage node, wherein a portion of the dielectric prevents lattice defects from propagating to the semiconductor material from a material forming the storage node.

In accordance with another aspect of the invention, a method of manufacture of a semiconductor device including a memory cell is provided including steps of forming an opening in a semiconductor layer formed on an insulator, forming a storage node through the opening, depositing an insulator layer over the storage node, forming a monocrystalline semiconductor layer by lateral epitaxial growth from the semiconductor layer over the insulator layer, etching a portion of the monocrystalline semiconductor layer to remove any crystal lattice dislocation resulting from said lateral epitaxial growth, forming an isolation structure in a volume created by said etching step, and forming a transistor in a remaining portion of the monocrystalline semiconductor layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
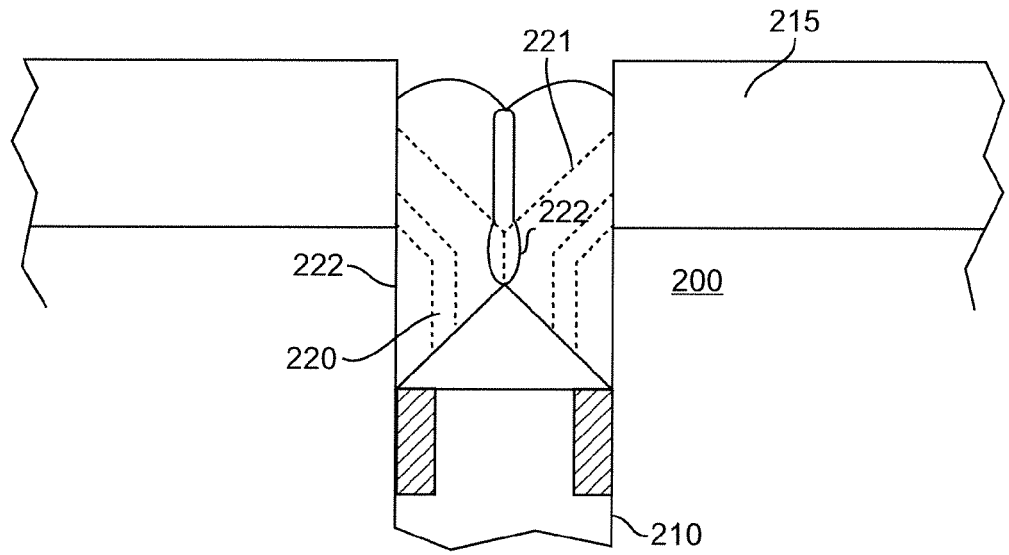
FIGS. 1A and 1B are cross-sectional diagrams of a known vertical memory cell structure formed using transistor on lateral epitaxy (TOLE) technology useful for conveying an appreciation of the advantages provided by the invention.
Figure 1B:
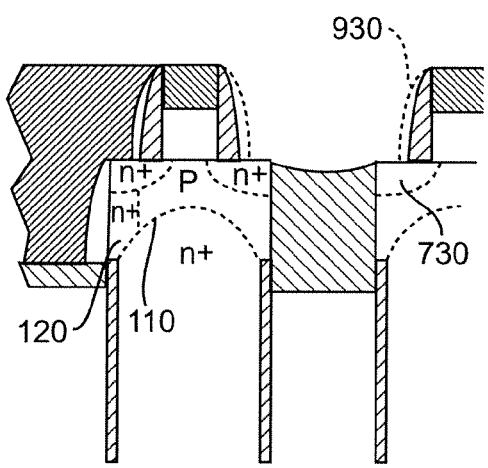

Referring now to the drawings, and more particularly to FIGS. 1A and 1B, there is shown a diagram of a cross-section of a known vertical memory cell as disclosed in U.S. Pat. No. 5,792,685 to Hammerl et al. over which the present invention provides several improvements and advantages. In this discussion, the term "vertical memory cell" will be used to generally refer to a DRAM memory cell in which the single access transistor is formed above the storage node/charge storage capacitor. Such a configuration essentially uses the same chip area for both the charge storage capacitor and the access transistor by placing the access transistor above the area occupied by the charge storage capacitor which is usually formed in a trench reaching into the semiconductor substrate of the chip. For that reason, the quality of semiconductor material (e.g. silicon, germanium or other Group III-V materials and alloys thereof) that must be formed above and subsequent to formation of the charge storage capacitor is often compromised unless particular and usually complex and/or critical silicon growth/deposition processes are employed. Additionally, such structures have generally required connection and isolation structures which, while capable of providing operable devices exhibiting salutary performance, are far from optimal as will now be discussed in regard to the known memory cell structure shown in FIGS. 1A and 1B which correspond to FIGS. 2D and 9A, of U.S. Pat. No. 5,792,685, respectively.

Specifically, referring to FIG. 1A, in an effort to provide improved quality of silicon (e.g. having a single crystal morphology) for formation of a transistor above a previously formed storage node/charge storage capacitor formed in a trench 210 which extends into a substrate 200, a single crystalline layer 215 is provided of the substrate from which, after lining the trench with a capacitor dielectric and filling the trench with deposited polysilicon and recessing the polysilicon, crystalline silicon can be selectively and epitaxially grown laterally from monocrystalline regions 215. Stages in this epitaxial growth (referred to as "lateral epitaxy" or, in connection with transistor formation, "transistor on lateral epitaxy" (TOLE) are depicted by dashed lines 220, 221 in FIG. 1A. However, it has been found that crystal lattice mismatches and/or dislocations are relatively likely to occur in the region indicated by reference numeral 222 when epitaxial growth 221 from respective sides of monocrystalline layer 215 meet within trench 210. Such lattice mismatches (sometimes referred to as "mis-fits") and dislocations provide a preferential path for charge leakage if isolation is less than complete or nearly so.

Figure 2:
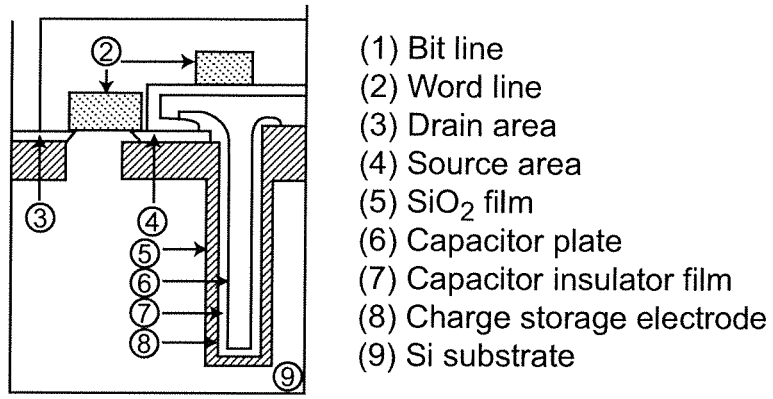
FIG. 2 illustrates, in cross-section, an early use of TOLE technology in regard to formation of a memory cell which will be useful in conveying an understanding of problems with obtaining improved memory cell performance using TOLE technology.
Figure 2:
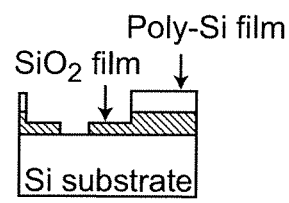
Figure 2:
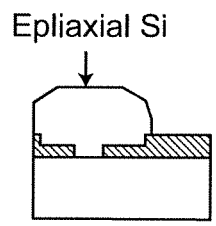
Figure 2:
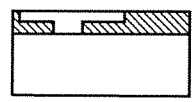
Figure 2:
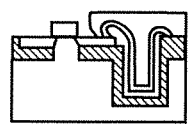

TOLE technology has been known for some years but is evidently not widely employed at the current time. Referring now briefly to FIG. 2, a sequence of steps for fabrication of a DRAM memory cell using TOLE is shown, as provided in FIG. 2 of "A new DRAM Cell with a Transistor on a Lateral Epitaxial silicon Layer (TOLE Cell)" by Kazuo Terada et al., IEEE Transactions on Electron Devices, Vol. 37, No. 9, September 1990, which is hereby fully incorporated by reference. In this case, the transistor is not formed above the storage node but adjacent thereto and lateral epitaxial growth is employed to form a "partial SOI" monocrystalline silicon deposit of very small depth in order to enhance immunity to soft errors due to alpha particle impacts and, perhaps incidentally, to reduce the amount of charge which must be stored for reliable operation; allowing operation at a reduced voltage or with reduced capacitance and footprint of storage nodes (for potentially increased integration density) or a combination thereof. To avoid/reduce the occurrence of crystal lattice dislocations in the lateral epitaxially grown silicon, the monocrystalline silicon is epitaxially grown from a "seed" exposure of silicon through an aperture which must be precisely rectangular with corners that are right angles of high fidelity; requiring an extremely complex and critical procedure using multiple lithographic patterning. Such processes are completely incompatible with forming a vertical memory cell with the transistor formed above the storage node and thus little, if any, increase in integration density was achieved. Further, while a five-fold improvement in reduction of alpha particle induced noise for an SOI film of about 150 nm thickness developed by lateral epitaxy compared to a bulk semiconductor device was observed, only an estimated 40% reduction in charge storage could be achieved consistent with reliable operation since both charge leakage and the capacitance of other structures (e.g. the capacitance of connections and the input capacitance of sense amplifiers (which form a capacitive voltage divider reducing sense amplifier input voltage) must be considered.

Referring now to FIG. 1B, additional features of the memory cell disclosed in U.S. Pat. No. 5,792,685, which detract from potential performance will now be discussed. First, in addition to the likelihood of development of lattice mismatches and/or dislocations providing a preferential charge leakage path to the access transistor channel located above the storage node, isolation of the access transistor from the storage node is provided only by junction 110 having a relatively large area which is thus also subject to excessive charge leakage. Further, the connection of the access transistor to the storage node is provided only by a heavily doped (n+) semiconductor region 120 which is difficult to form while the implantation required for its formation can also compromise the quality of the silicon from which the transistor is formed by potentially constituting a source of additional lattice dislocations and defects that can provide additional preferential charge leakage paths.

These difficulties and limitations on potential performance of the memory cell of U.S. Pat. No. 5,792,685 and other known DRAM memories and memory cell structures are avoided in accordance with the features of the present invention which include but are not limited to provision of highly effective isolation using a dielectric material, removal of any potential crystallographic lattice dislocations or mis matches, assurance of high quality semiconductor material for formation of the access transistor(s) and provision of metal strap connections to the access transistor and between the access transistor and storage node by non-critical processes having wide process windows and high manufacturing yield. These features and advantages of the present invention will become apparent from the following discussion of the fabrication of memory cells in accordance with the invention.

Figure 3:
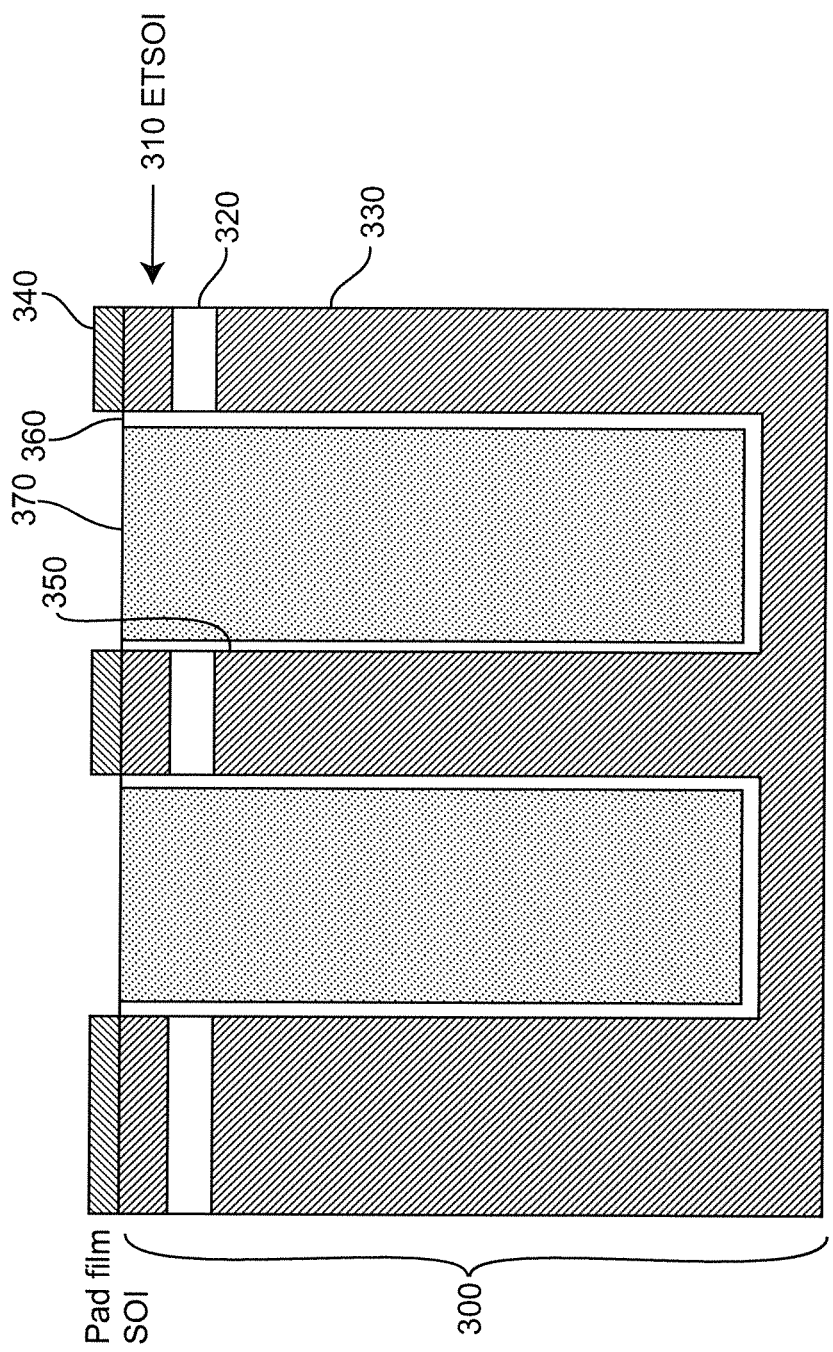
FIGS. 3, 4, 5, 6, 7, 8, 9, 10, 11, 12, and 13 are a sequence of cross-sectional diagrams illustrating a preferred method of manufacture of the invention.

Referring now to FIG. 3, the preferred method of manufacture of the memory cell and memory array in accordance with the invention in order to develop all of the above features in a single device begins with a semiconductor-on-insulator substrate or wafer 300 which is preferably of the extremely thin SOI (ETSOI) type (e.g. having an active semiconductor layer 310 of 10 nm thickness or less over an insulator layer 320 (sometimes referred to as a buried oxide or BOX layer, regardless of actual composition) on a so-called handling substrate 330) but it should be understood that the invention is completely applicable to any thickness of active semiconductor layer or even bulk semiconductor material by using variations of isolation from the substrate, such as, for example, deep collar isolation, which will be evident to those skilled in the art; a thin active semiconductor layer being preferred to reduce susceptibility to alpha particle induced noise and/or soft errors and to provide some combination of improved operating margins, reduced charge storage requirements for reliable operation and/or increased integration density through decreased charge storage capacitor footprint with the access transistor formed thereon.

A pad film 340, preferably of nitride, is then applied as a blanket layer and patterned by any desired processes before deep trench etching which is preferably performed by reactive ion etching (RIE), to the SOI wafer and patterned to define storage node/capacitor locations. (Other conventional steps such as use of a thick hard mask material on the pad film which may be required or desirable are not shown or discussed since their use will be evident to those skilled in the art and, in any event, such processes are not important to the understanding or practice of the invention.) The principal function of the pad layer is to protect the access transistor sites until later formation of shallow trench isolation and formation of the transistors as will be discussed below and many materials and methods and sequences of application are known which are suitable for application of the pad film 240.

Deep trenches 350 are then etched after a thick hard mask (e.g. 1 μm of oxide) and the pad film are patterned, lined with capacitor dielectric 360 and filled with polysilicon 370 to the surface of the active semiconductor layer 310. The particulars of formation of storage nodes is not at all critical to the successful practice of the invention and numerous process sequences for forming the storage nodes are known and suitable for use in the practice of the invention. By the same token, any type of capacitor design, configuration or structure is suitable for practice of the invention although deep trench (DT) capacitor designs are preferred as providing generally larger values of capacitance in a given area.

Figure 4:
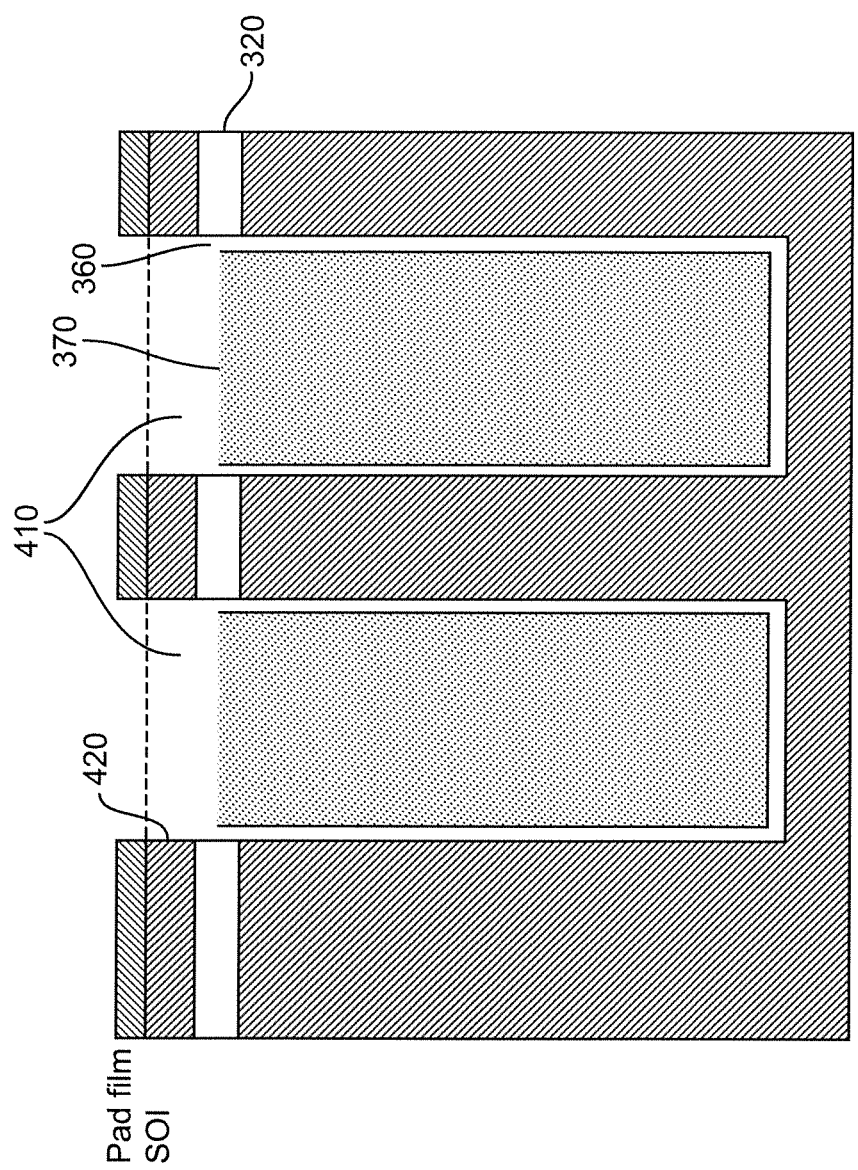
Figure 5:
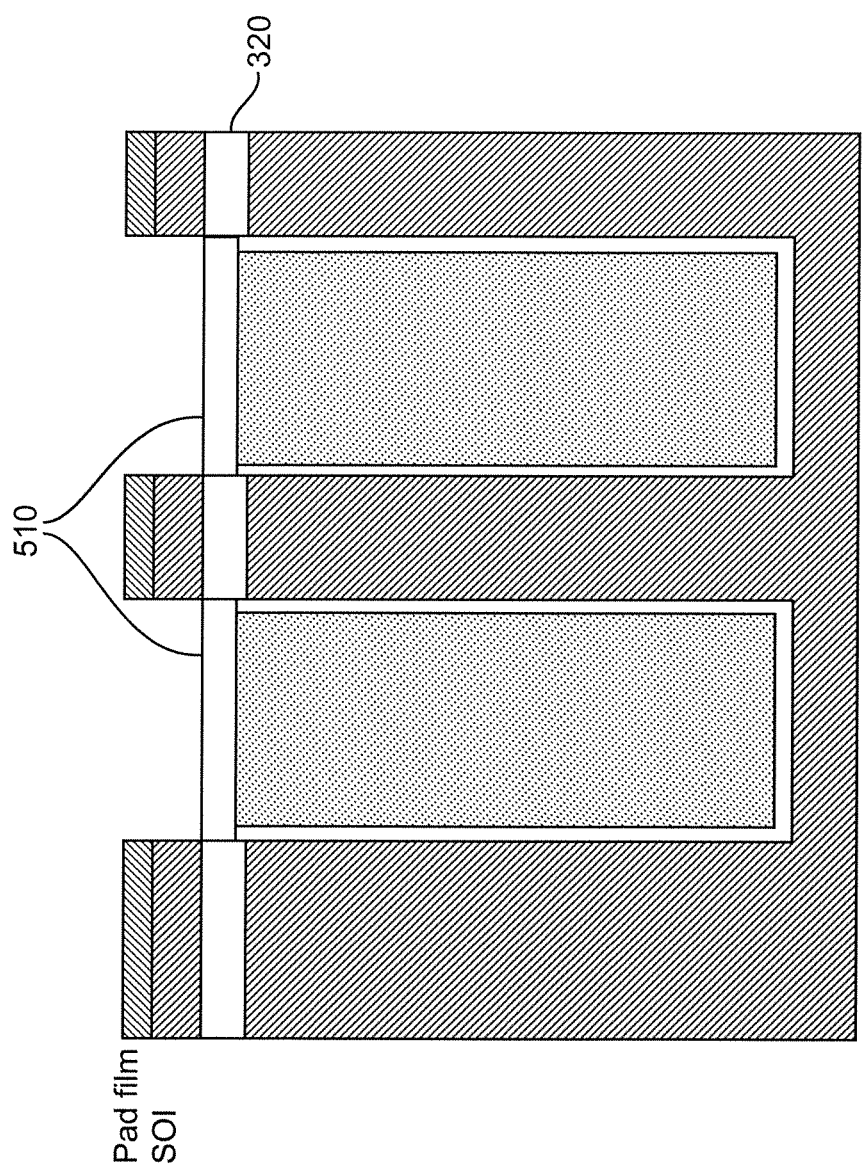

Then, referring to FIG. 4, the polysilicon fill 370 and capacitor dielectric 360 are then recessed such that the upper surface thereof is located within the thickness of the insulator or buried oxide (BOX) layer 320 by etching of the material volume indicated by reference numeral 410. The principal function of the recessing of the dielectric and polysilicon fill is to fully expose edge 420 of apertures in the active semiconductor layer 310 and is thus not particularly critical in regard to the amount of recess that is achieved. A timed etch process is entirely adequate to achieve the recessing of the capacitor dielectric and polysilicon fill. Then, as illustrated in FIG. 5, dielectric fill 510 and recess of the dielectric to the approximate surface of the BOX layer 320 is performed within the trenches. It should be noted that this process essentially replaces portions of the BOX layer 320 which were previously removed.

Figure 6:
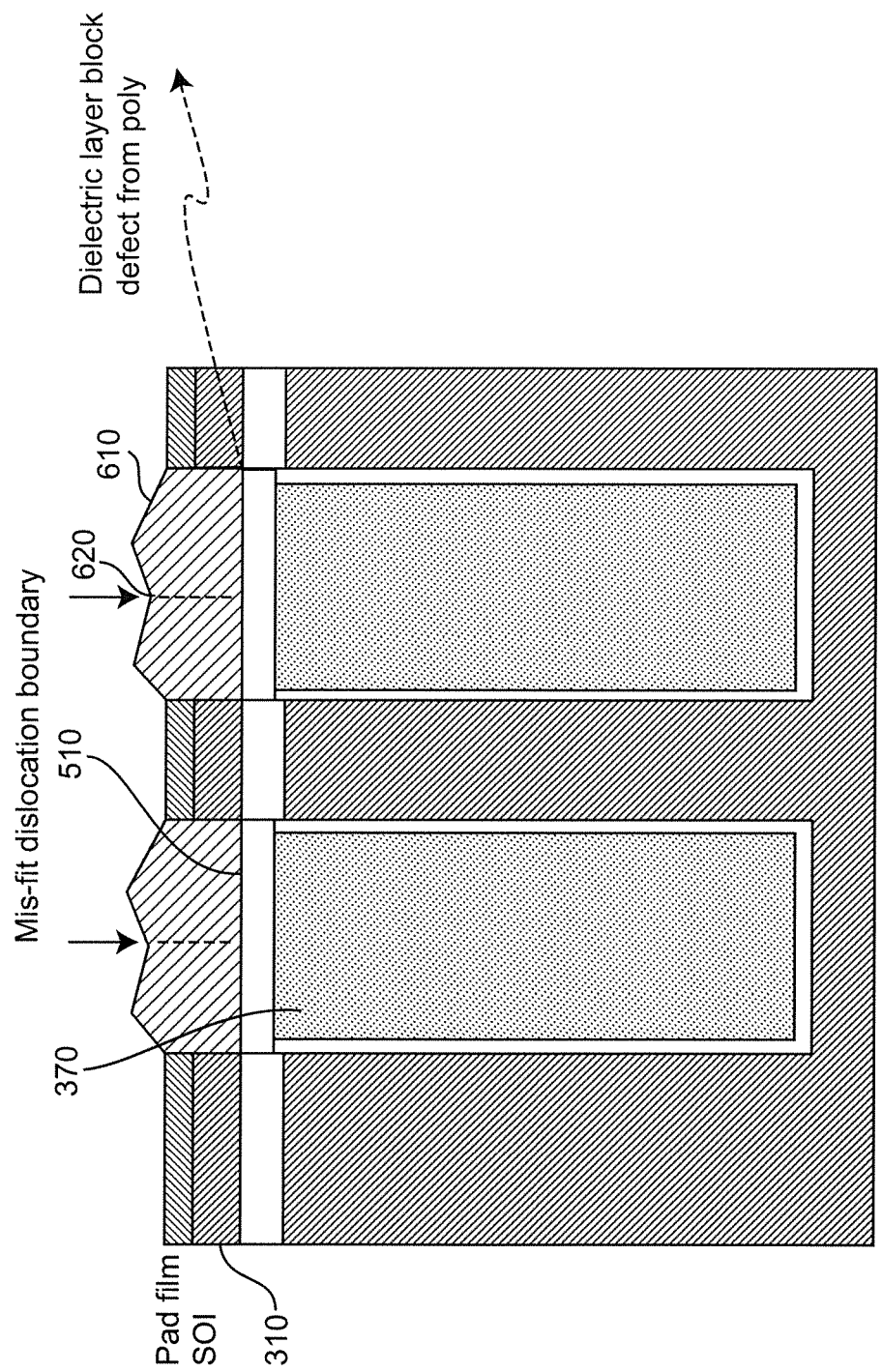

As shown in FIG. 6, semiconductor material is epitaxially grown laterally from edges 420 in the active semiconductor layer 310 as shown at 610. As alluded to above, a crystal lattice mismatch/mis-fit or dislocation boundary will generally occur where the lateral epitaxial growth regions meet (e.g. centrally of the dielectric fill 510) as alluded to above. It should be noted in this regard, that the dielectric layer 510 prevents crystal lattice dislocations and defects from propagating from the surface of the polysilicon fill 370 during the lateral epitaxial growth process; thus assuring high quality monocrystalline silicon will be produced by the lateral epitaxial growth (due to growth from the original monocrystalline semiconductor) other than at the dislocation boundary 620. It is also very important to note that the presence of dielectric fill 510 prevents the silicon (or other semiconductor material) growth from extending vertically as in U.S. Pat. No. 5,792,685, as shown in FIG. 1A (which is not epitaxial growth and usually of low quality). The presence of the dielectric insulator layer above the storage node may also improve alpha particle noise immunity with crystalline silicon material as an active layer on a dielectric layer. In other words, the insulation layer 510 is of substantially the same thickness of and is substantially coplanar with the insulator layer of the SOI wafer and the monocrystalline semiconductor layer that will form the conduction channel of the access transistor is of substantially the same thickness of and substantially coplanar with the active layer or the SOI wafer. Further, it is an important feature of the invention that the storage node is entirely surrounded by dielectric (except at a contact thereto which will be formed later) which not only blocks charge leakage from the storage node but prevents lattice dislocation formation which can form charge leakage paths.

Figure 7:
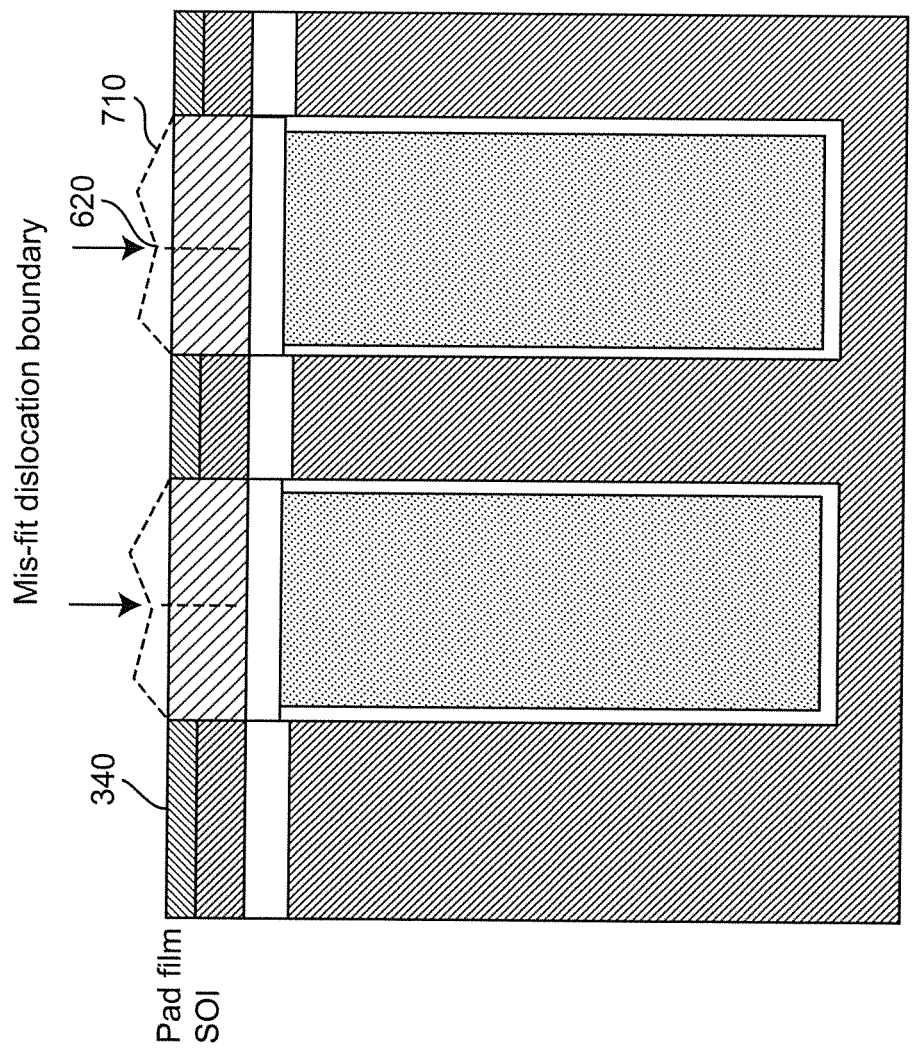
Figure 8:
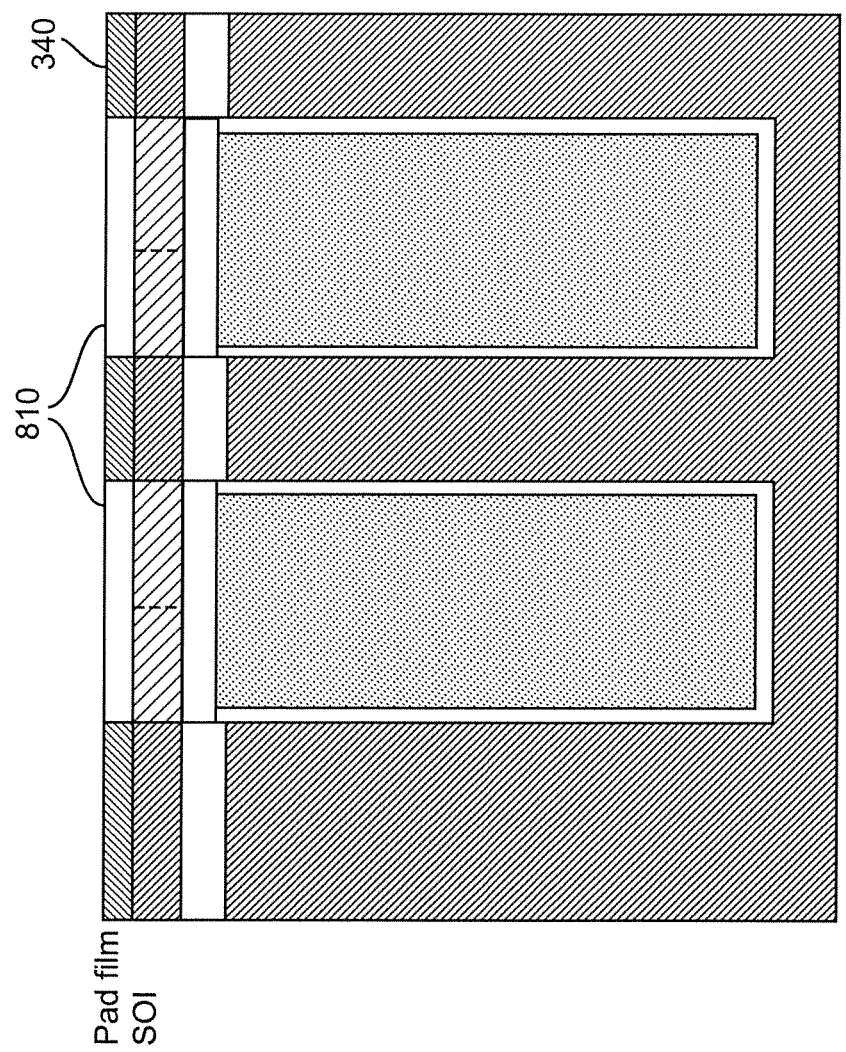
Figure 9:
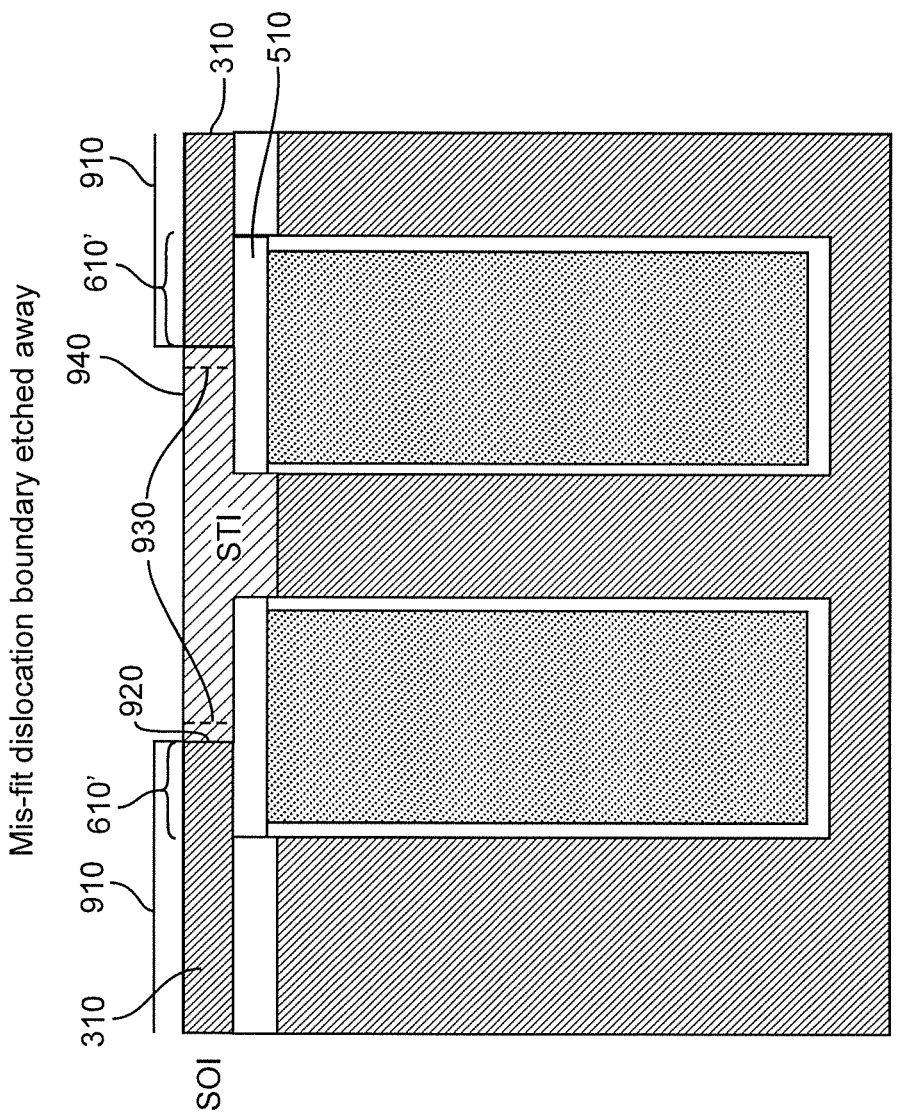

Then, as shown in FIG. 7, the semiconductor material is planarized to the surface of the pad film 340 (e.g. by removal of the material indicated by reference numeral 710), preferably by chemical/mechanical polishing (CMP). It should be noted that this planarization does not entirely remove the lattice dislocations that may have occurred during the lateral epitaxy process. The thickness of the laterally grown epitaxial semiconductor (the invention is not limited to silicon although silicon is preferred for most applications) is then adjusted by etching away material as indicated at 810 of FIG. 8. Then, as shown in FIG. 9, the pad film 340 is removed as a resist mask 910 is applied and patterned. The resist 910 will also serve to protect the active semiconductor layer 310 as well as the planarized extensions 610' thereof much in the manner of the protection provided by the pad film 340 as alluded to above. Resist 910 is then patterned to expose the region between the filled deep trenches and approximately one-half (or, preferably, slightly more, as shown by reference numerals 920, 930) of the semiconductor material grown by lateral epitaxy. The exposed surface is then etched and an insulating material deposited to form shallow trench isolation (STI) 940 between and extending over a portion of the storage nodes including a portion of dielectric layer 510 which remains intact or substantially so during this processing.

It should be noted that the registration of patterning of resist layer 910 is not particularly critical and that the etching of the exposed surfaces will reliably remove any lattice dislocations that may be present as long as the patterning or the subsequent etching reaches any portion of the region where such lattice dislocations are present. The material at the lattice dislocations will etch substantially faster than the monocrystalline portion of the material grown by lateral epitaxy and the dislocations will be reliably removed completely prior to completion of removal of the monocrystalline material. Thus, monocrystalline semiconductor material devoid of lattice dislocations attributable to lateral epitaxy processes can be provided in a simple and reliable manner.

Figure 10:
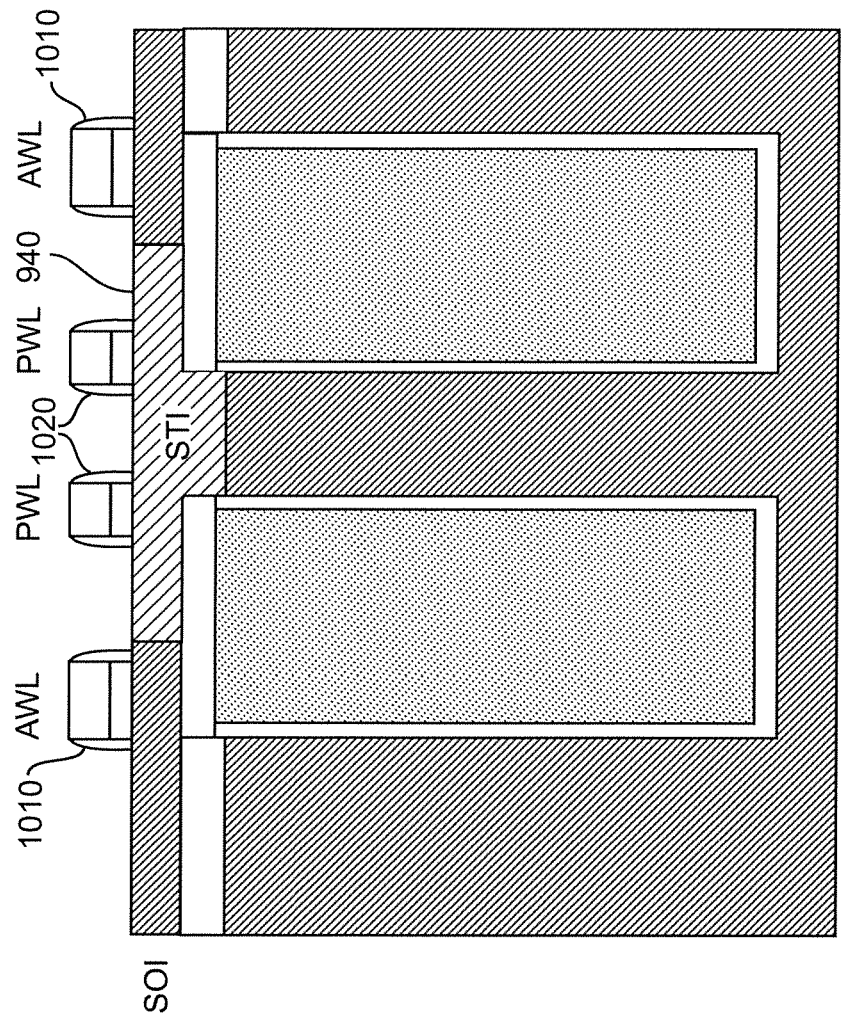

Word lines can then be applied as shown in FIG. 10 using any of a number of techniques which are well-understood in the art. Word lines 1010 which are formed over the semiconductor material which is formed by lateral epitaxy form access transistors and are thus designated as active word lines (AWL). It is also an important feature of the invention that the surface of the STI region 940 also provides substantial area where word lines can be placed for access to other storage nodes (e.g. above or below the plane of the page of FIG. 10). The STI structure 940 prevents the formation of transistors and these word lines are thus designated as passive word lines (PWL) 1020 even though they function actively for accessing memory cells in other regions of the memory device. As is well-understood in the art, the capacitance of the word line connection from memory cells to sense amplifiers is critical in regard to operating voltage and operational margins. Thus the number of access transistors (each having a finite gate capacitance) that can be connected to a word line is limited. Conversely, the dimensions of the STI structure tend to minimize the capacitance of regions of passive word lines; permitting relatively long connections to access transistors on relatively remote portions of a memory chip.

Figure 11:
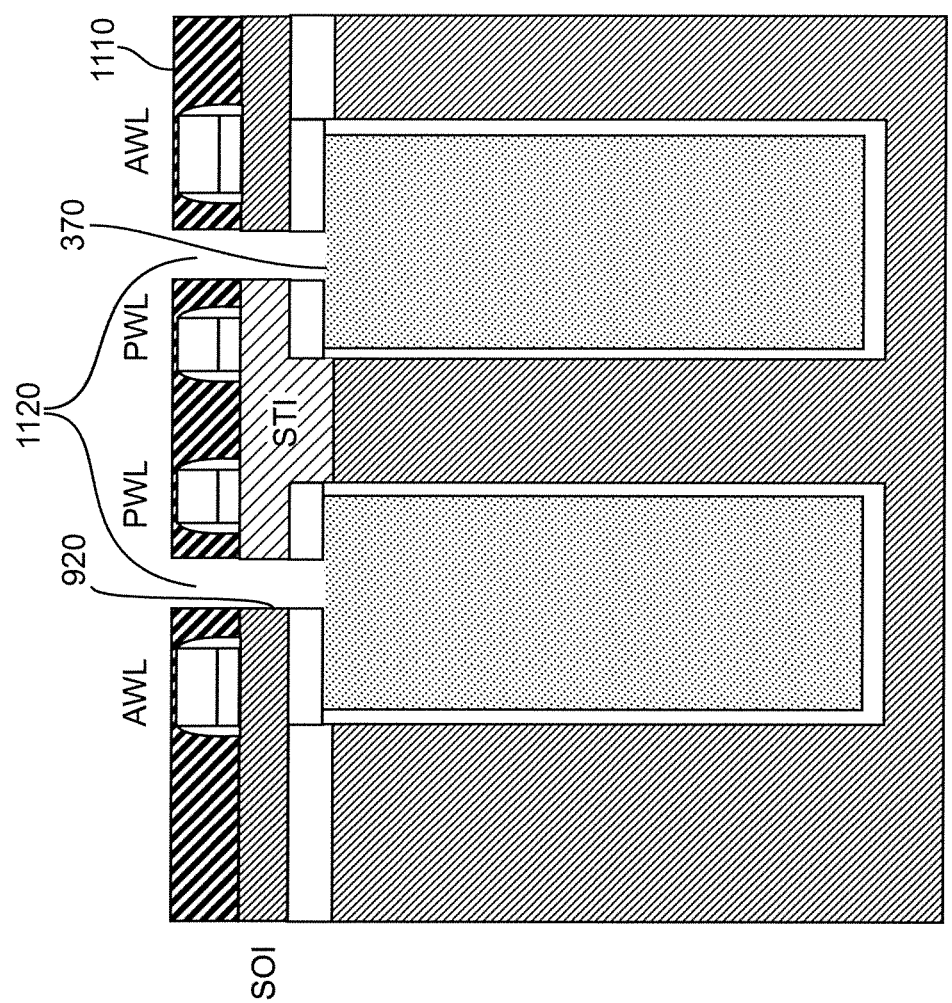
Figure 12:
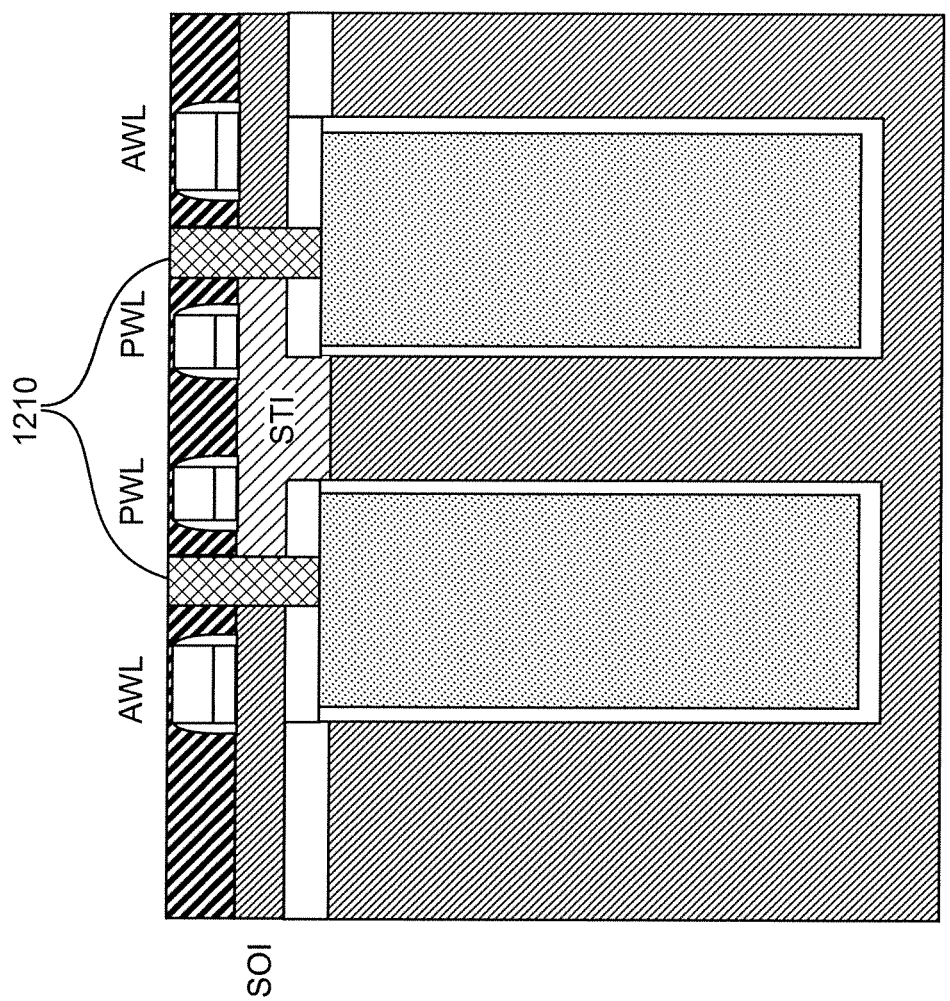
Figure 13:
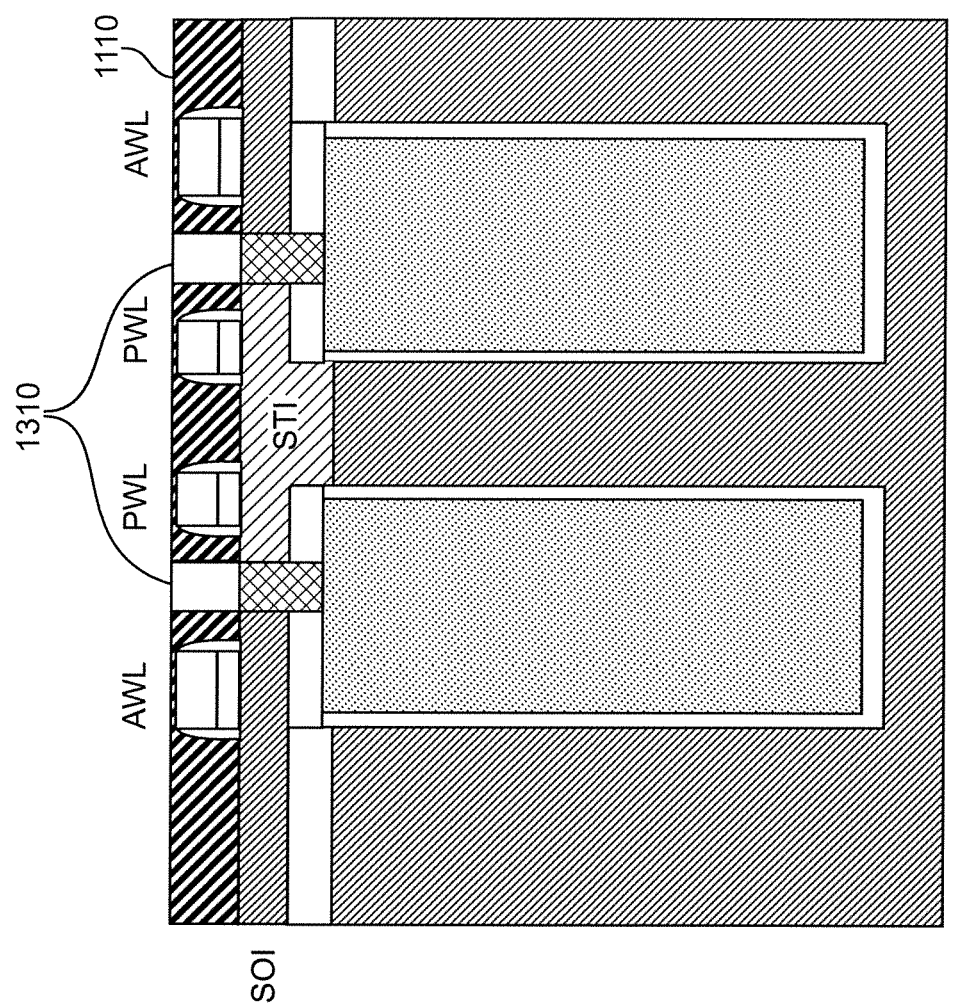
Figure 14:
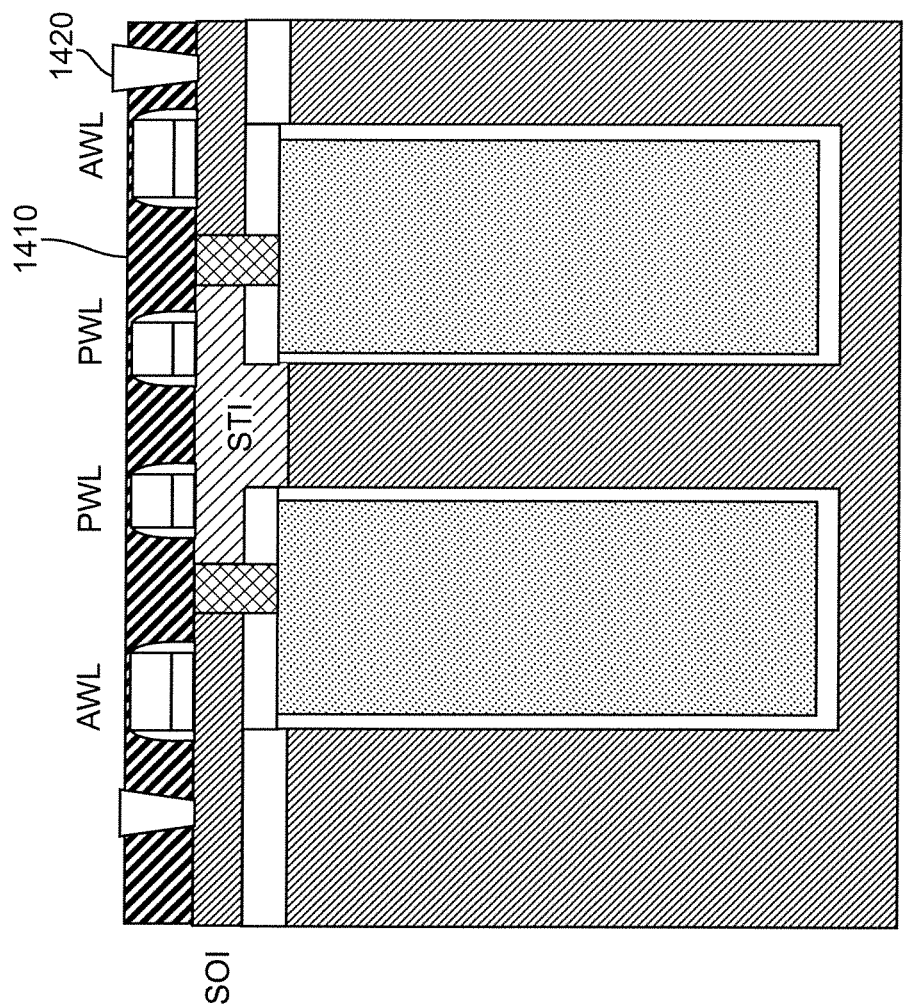
FIG. 14 is a cross-sectional diagram illustrating a substantially complete pair of memory cells in accordance with the invention.

To complete the memory cell and memory array structure (other than the so-called support section of the memory device where addressing logic, drivers and sense amplifiers are located; the particulars of which are unimportant to the understanding or practice of the invention), an interlayer dielectric (ILD) 1110 is applied and preferably planarized to cover and support the word lines 1010, 1020 and apertures are formed which contact or intersect with edge 920 of the semiconductor material grown by lateral epitaxy and extending to the polysilicon DT fill 370 as shown in FIG. 11. The aperture can then be filled with metal 1210 to form a strap to connect the source or drain (S/D) of the access transistor to the storage node, as illustrated in FIG. 12. Since no connection is required at the surface of the ILD 1110 the metal strap 1210 can be optionally recessed as shown at 1310 of FIG. 13 and the recess filled with ILD material as depicted at 1410 of FIG. 14. Similarly, a metal strap connection can be made to the other source or drain (S/D) conduction terminal of the access transistor(s) as shown at 1420 of FIG. 14. such metal strap connections are advantageously of low resistance as compared with semiconductor or silicide connections and thus improve operating margins in comparison therewith.

In view of the foregoing, it is clearly seen that the invention provides a memory cell and memory array device structure in which the access transistor can be formed above a portion of the storage node to form a vertical memory cell of small footprint are that will support high density integration. Charge leakage is effectively prevented by providing dielectric encapsulation of the storage node/capacitor while the active SOI layer and the portion thereof which is grown by lateral epitaxy may be maintained very thin over the entire extent of the access transistor and, moreover, the dielectric isolation prevents lattice dislocations from forming or propagating from the polysilicon of the storage node. The provision of a relatively broad STI structure over a portion of the storage node allows lattice dislocations to be reliably removed to further improve the quality of silicon for formation of the access transistors and their connections to the storage node while providing ample space for passive word lines of low capacitance. The method of manufacture and the structure of the memory cell also allow low-resistance metal straps to be connected to the access transistor and deep trench capacitor. Thus, a memory cell and memory array device (or any other type of semiconductor device such as a processor or logic array which may include such a memory cell or array thereof) of significantly improved performance and properties and capable of very high density integration can be manufactured using well-understood and high-yield process sequences.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of manufacture of a semiconductor device including a memory cell, said method including steps of
    forming an opening in a semiconductor layer formed on a buried insulator,
    forming a storage node through said opening,
    depositing an insulator layer over said storage node to prevent crystal lattice dislocations propagating from the storage node, wherein a surface of said insulator layer is formed substantially coplanar with said buried insulator,
    forming a monocrystalline semiconductor layer by lateral epitaxial growth from edges of said semiconductor layer over said insulator layer,
    etching said monocrystalline semiconductor layer to remove any remaining crystal lattice dislocation resulting from said lateral epitaxial growth,
    forming an isolation structure in a volume created by said etching step, and
    forming a transistor structure on a remaining portion of said semiconductor layer and a planarized extension region of said semiconductor layer.

2. A method as recited in claim 1, including a further step of
    forming conductors on said isolation structure.

3. A method as recited in claim 1, including a further step of
    forming a metal connection between said transistor structure and said storage node.

4. A method as recited in claim 3, including a further step of
    forming a further metal connection to said transistor structure.

5. The method as recited in claim 1, wherein said monocrystalline semiconductor material has a thickness of up to 10 nm.

* * * * *